United States Patent [19]

Chai et al.

[11] Patent Number: 4,686,762
[45] Date of Patent: Aug. 18, 1987

[54] FABRICATING SEMICONDUCTOR DEVICE WITH POLYSILICON PROTECTION LAYER DURING PROCESSING

[75] Inventors: Sang-Hoon Chai, Daegu; Jin-Hyo Lee, Qumi, both of Rep. of Korea

[73] Assignee: Electronics and Telecommunication Research Institute, Chungchungnam, Rep. of Korea

[21] Appl. No.: 889,491

[22] Filed: Jul. 23, 1986

[30] Foreign Application Priority Data

Aug. 5, 1985 [KR] Rep. of Korea .................... 5633/85

[51] Int. Cl.$^4$ .......................................... H01L 21/308
[52] U.S. Cl. ...................................... 437/36; 29/591;
29/576 W; 148/1.5; 148/DIG. 11; 148/DIG.
124; 148/DIG. 51; 148/DIG. 117; 357/34;
357/59; 156/643; 156/653; 437/967
[58] Field of Search ............ 29/578, 590, 591, 576 W;
148/1.5, DIG. 11, DIG. 124, DIG. 117, DIG.
51; 357/34, 59 H; 156/657, 643, 653

[56] References Cited

PUBLICATIONS

*IEEE Journal of Solid-State Circuits*, vol. SC-20, No. 1, Feb. 1985.
*IEEE Transactions on Electron Devices*, vol. ED-30, No. 6, Jun. 1983.
*IEEE Transaction on Electorn Device*, vol. ED-28, No. 9, Sep. 1981.
*IEEE Journal of Solid-State Circuits*, vol. SC-14, No. 2, Apr. 1979.

*Primary Examiner*—Brian E. Hearn
*Assistant Examiner*—Kevin McAndrews
*Attorney, Agent, or Firm*—Morgan & Finnegan

[57] ABSTRACT

A method for making a semiconductor device having transistors comprising the active regions which are protected by polysilicon layer during the whole process from damages due to the other processing, that is dry etching, etc. and a minimized base region so as to provide a high operating speed and a minimum size thereof as well as lowest power consumption features.

1 Claim, 10 Drawing Figures

FABRICATING SEMICONDUCTOR DEVICE WITH POLYSILICON PROTECTION LAYER DURING PROCESSING

BACKGROUND OF THE INVENTION

1. Field of the Invention

The present invention relates to a process for fabricating a semiconductor device and more particularly, a process for fabricating a high-speed bipolar transistor which operates even in the region for very high frequency.

2. Description of the Related Art

Generally, to enhance the performance of integrated circuts (IC), it is important to reduce the power consumption there of in addition to increasing the operating speed. To the end, it is necessary that the individual elements in the IC must be reduced in minimum size as possible as and more fast in the operation speed.

Among the IC, particularly, a bipolar transistor which is used commonly for systems requiring a high speed of operation, for example, a central processing unit, a communicating system, etc. needs further improvements in the size of the element itself and in the operating speed as well as in the power consumption.

In the prior art, isolation method by means of P-N junction region which has been mainly used to produce bipolar IC involves a lot of restrictions in the reduction of the size of the element because the influence due to lateral diffusion, the existence of depletion region and the likes should be taken into account. Accordingly, it was difficult to expect a desired results in view of the operating speed and the power consumption because the reduction of resistance component and capacitance component which exist in the element itself is restricted to a certain limited extent.

Another prior art isolation method developed recently to solve such a problem as mentioned here in above, as shown in FIG. 2, uses a combination method of an element isolation method by means of oxide layer(SiO$_2$), and other method which is accomplished by forming a self-aligned structure of emitter(22) and base(24) by means of polysilicon layer(21), the transistor fabricated in this way is so-called PSA (polysilicon self-aligned) transistor.

Where the transistor is fabricated by this method, the size of element is reducible to a desirable extent, and emitter region(22) and base region(24) can be made in shallow junction.

Accordingly, the resistance component and the capacitance component which exist in the element are also reducible to a desire extent, thus obtaining advantages in all respects including operating speed, power consumption, packing density, etc.

FIG. 2 shows the cross sectional view of biplar NPN transistor produced by the PSA method.

In producing the PSA bipolar NPN transistor whose emitter region and base region are self-aligned by a polysilicon, to eliminate a series resistance component which exists in the base region, P+-type extrinsic base region which has high impurity concentration as a portion(23) shown in FIG. 2 must be provided between P--type intrinsic base region and P--type polysilicon layer which acts a role as an exterior conductive line of the base.

However, where the area of P+-type extrinsic base region is large, the capacitance component increases since minority carrier storage produced in this portion becomes larger, so that the operating speed is decreased.

There was provided with a transistor produced by means of a method newly developed to solve the above problem. As shown in FIG. 3, it assumes a form where P+-type extrinsic base region(33) which has a width of 4000 to 6000 Å is provided by overeching the 1500 Å-thick oxide layer(32) in the lower part of polysilicon layer(31) to the extent of 4000 to 6000 Å using a wet etching process, filling it up with P+-type polysilicone using a low pressure chemical vapor deposition (LPCVD) and then annealing it.

Although the bipolar NPN transistor made in this manner introduces a marked impovement upon the operating speed; it is difficult to adjust the process condition because the width of P+-type extrinsic base region is determined by wet etching.

Further, since the process for fabricating the NPN transistor is conducted in the state that a portion in which emitter is to be formed is exposed, the surface of the exposed portion may suffer damage during the progress of process, particularly, in the stage of dry etching and the electrical property thereof may become worse.

The object of the present invention is to provide a process for fabricating a high-performance semiconductor device which has eliminated the aforementioned problem.

The other object of the present invention is to provide a process for fabricating a semiconductor device having features which are a high speed of operation, a minimum size and a small power consumption.

The further object of the instant invention is to provide a process for fabricating a semiconductor device characterized by a protection of a portion in the surface of the substrate, which is provided the operation region of transistor, with polysilicon layer from damages.

SUMMARY OF THE INVENTION

The present invention relates to a process for fabricating the semiconductor device, which is characterized by the protection of surface having a portion to be formed with P+ extrinsic base from influences generated in the progress of process.

Therefore, semiconductor device according to the present invention is charaterized in that the power consumption thereof can be reduced and the operating speed can be greatly increased.

The present invention may also provide a scale-downed semiconductor device having high packing density.

Other features and advantages of the present invention will become apparent from the accompanying drawings made in conjunction with the detailed description of the presently preferred embodiment thereof.

DETAILED DESCRIPTION OF THE PREFERRED EMBODIMENTS

Figure 4:
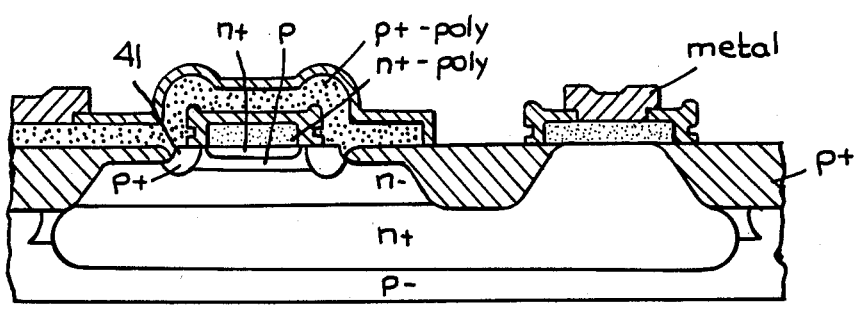
FIG. 4 is a cross sectional view of bipolar NPN transistor produced according to a method of the present invention.

As the bipolar NPN transistor manufactured according to the present invention has a base region of size reduced to the minimum as compared with that of prior transistors, the width of P+ extrinsic base region(41) as shown in FIG. 4 can be made accurately by 2000 through 3000 Å according to necessary usage.

The bipolar NPN transistor manufactured under the present invention has the advantages of obtaining not only a satisfactory electric property respectively in each elements but also satisfactory yield in the whole span of wafer because an emitter by polysilicon is formed in the initial stage of process, so that the operation region of transistor is protected by polysilicon layer from damage due to the other processing steps until the process comes to a finish, as shown in FIGS. 5A-5F.

Figure 5A:
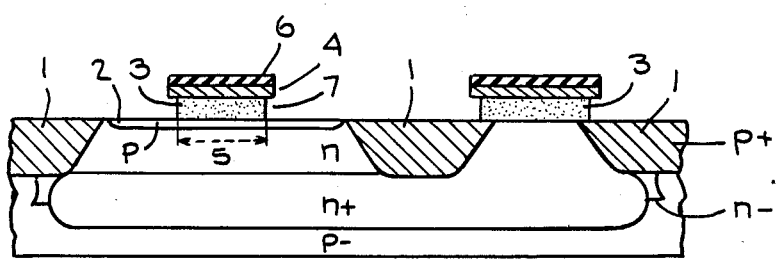
FIGS. 5(A)-5(F) are cross sectional views representing a consecutive steps of bipolar NPN transistor produced according to a process of the present invention.
Figure 5B:
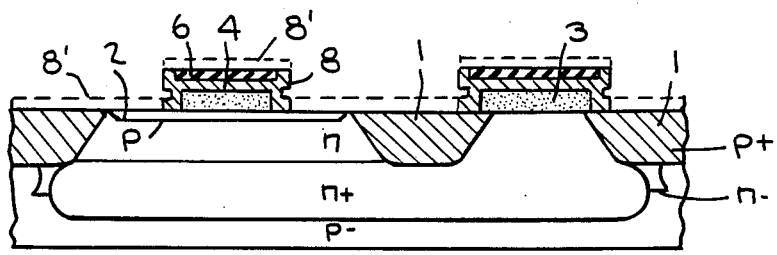
Figure 5C:
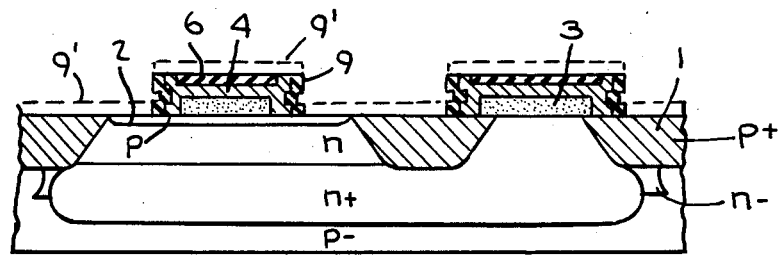
Figure 5D:
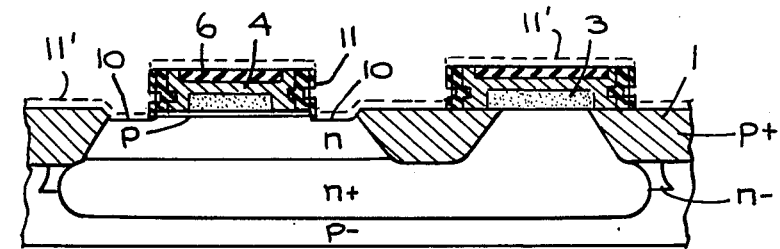
Figure 5E:
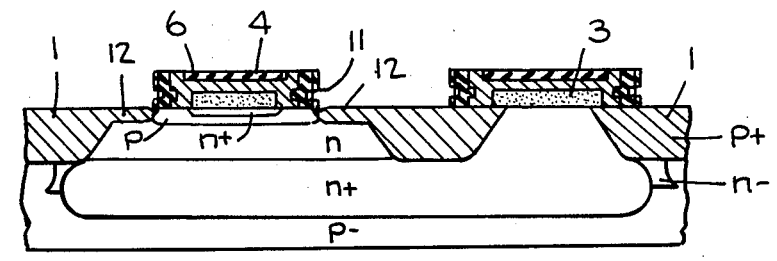

As the manufacturing method according to the present invention has the almost same steps of process as that of the prior PSA transistor with the exception of process steps as shown through in FIGS. 5C-5E, thus the present method is characterized by being able to separately manufacture a general PSA transistor which can be prepared by simple process and a high-speed transistor with P+ extrinsic base region of size reduced to the minimum.

When an explanation is given to it according to the presently preferred embodiments shown in FIG. 5, it comes as follows.

DESCRIPTION OF THE PREFERRED EMBODIMENTS

FIG. 5A is a cross sectional view of a substrate which has an element isolated by means of oxide layer(1).

That is, the substrate as shown in FIG. 5A can be obtained by the following steps. Arsenic impurities are ion-implanted by usage of a mask which is prepared by means of 10KÅ-thick oxide layer on the surface of P−-type silicon wafer on. Then, N+ burried layer is provided by diffusing the ion-implanted arsenic impurities at 1200° C. After removing the mask of the oxide layer completely, N− type epitaxial layer, which is doped by phosphorus and is of resistivity of 0.2 cm, is grown to 1.6 μm thick. Then oxide layer (SiO$_2$) of 500 A and nitride layer(Si$_3$N$_4$) of 2000 Å are used as a mask material for a step to etch silicon surface in the portion of the silicon substrate, where oxide layer(1) for element isolation is to be formed, to the depth of 5500 Å and then for a next step to ion-implant the phosphorus for forming the P+ isolation layer. The oxide layer(1) of 10KÅ-thick is grown at 925° C. by the wet oxidization method.

Next thereto, base(2) is formed by ion-implantation of the boron impurities and the entirety of wafer is deposited with 3000 Å-thick polysilicon layer by LPCVD. Then, it is made into N+-type by ion-implantation of the arsenic impurities. The surface of of the 3000 Å -thick polysilicon layer is deposited with primary oxide layer(4) which has a thickness of 2000 Å and then primary nitride layer(6) which is 2000 Å in thickness by means of LPCVD. Here, polysilicon portion(3) where an emitter and collector are to be formed is defined by photolithography and unnecessary portion of the layers(4,6) is removed by means of dry etching. In this stage, the surface of silicon is protected by the final (the 3000 Å -thick) polysilicon layer by being etched through wet etching after leaving some 500 Å in the process of dry etching and as shown in N+ polysilicon layer(3), actual emitter width(5) is made into the size reduced much more than the defined width of 2 μm by overetching underneath the oxide layer.

FIG. 5B shows a process step in which the oxide layer for electric isolation is formed on the emitter and on both wall sides of N+ polysilicon(3) which forms an exterior conducting line. After it is deposited with the secondary oxide layer of 2500 Å by means of LPCVD, the oxide layer(8') which is a part of the secondary oxide layer on the upper part of polysilicon is completely removed by means of reactive ion etching such as one of the dry etchings and the oxide layer(8) on the side thereof is made to remain as it is to form the oxide layer on both wall sides. Here, the primary oxide layer(4) is not damaged, being protected by the primary nitride layer(6).

This method is a typical method, which utilizes characteristic of dry etching. That is, it takes advantage of the fact that when the object layer such as the oxide layer or nitride layer is etched by means of dry etching, it is etched only horizontally and not vertically.

FIG. 5(C) shows a process step for forming the secondary nitride layer(9) so as to make up P+ extrinsic base region(14). Firstly the entirety of upper surface of wafer is deposited with the secondary nitride layer by means of LPCVD.

Here, the thickness of secondary nitride layer is an important element which determines the width of extrinsic base region. By properly adjusting this thickness, it is possible to form easily the P+ extrinsic base region which has an extremely narrow width characterized by the present invention.

In the present invention, the thickness is adjusted between 2000 Å through 3000 Å as needed. With etching the secondary nitride layer by means of plasma etching such as one of the dry etchings, nitride layer(9) is made to form only on both wall sides, as the oxide layer(8) in the case of the secondary oxide layer(8).

FIG. 5(D) shows a process step for forming the tertiary nitride layer(11) so as to prevent growth of the bird's beak-looking oxide layer which generates when the oxide layer(12) for isolation grows, to the position where P+ extrinsic base is to be formed.

As a preliminary step to form the oxide layer(12) for isolation, the surface of silicon around the polysilicon layer is etched by 1500 Å by means of dry etching. Then, the buffer oxide layer of 500 Å is grown on the etched surface of silicon and the surface of the buffer oxide layer is deposited with the tertiary nitride layer (11) of about 700 Å by means of LPCVD. And as main step, the tertiary nitride layer(11) is etched by means of plasma etching method so as to remain the tertiary nitride layer(11) only on the side wall of silicon(10) etched to the degree of 1500 Å as shown in FIG. 5(D). Therefore when the oxide layer for isolation is grown in the next step, Bird's beak-looking oxide layer is completely prevented.

FIG. 5(E) shows a process step for growing an oxide layer(12) for isolation. The oxide layer(12) of 2500 Å is grown on the silicon etched to the degree of 1500 Å by means of wet oxidation at 925° C. Here, a portion which is to be P+extrinsic base region is protected by the secondary nitride layer against the growth of oxide layer.

Figure 5F:
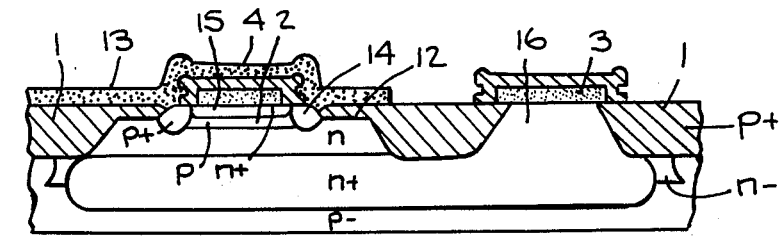

FIG. 5(F) shows a process step for forming P+extrinsic base region(14) by means of P+ polysilicon layer(13).

Preliminary, by removing the primary, secondary and tertiary nitride layers by means of wet etching method, the portion which is to be P+ extrinsic base region is opened.

The extremely narrow P+extrinsic base region provided by the present invention is formed underneath the secondary nitride layer of 2000 Å through 3000 Å in thickness. A width of the base region is similar to the thickness of secondary nitride layer. As a next step, polysilicon of 3000 Å thickness is deposited on the whole surface of the substrate by means of LPCVD. A character of the polysilicon layer is converted into P+-type by doping boron by means of thermal diffusion. By photolithography and dry etching method, a portion of the converted polysilicon layer(13) is defined as a P+ polysilicon layer. A region of the P extrinsic base is formed by thermal diffusion again.

The process step for depositiong of metal layer as a following step is the same with that of the ganeral transistor manufacturing process and metal layer of 8000 Å thickness is formed by the vapor deposition of aluminum under vacuum circumstance. The bipolar NPN transistor manufactured through the aforementioned process steps is shown in FIG. 4.

What is claimed is:

1. A process for fabricating a semiconductor device having a plurality of elements isolated in P--type silicon substrate by steps of forming N+-type buried layer; implanting arsenic ions into the surface of said silicon substrate and diffusing it at 1200° C.; growing N+-type epitaxial layer having a thickness of 1.6 μm by doping phosphorus ions on said burried layer; etching a portion of the surface of said epitaxial layer in depth of 5500 Å with a mask; and implanting P+-type impurity ions through said mask at 925° C. by wet oxidation method to form an oxide layer of 10KÅ in thickness, said process comprising further the consecutive steps of forming a base region by implanting boron impurity ions;

depositing a polysilicon layer of 3000 Å in thickness throughout the entire surface of said silicon substrate by LPCVD;

converting the conductivity of said polysilicon layer into N+-type conductivity by implanting arsenic impurity ions therein;

depositing the surface of said polysilicon layer consecutively with primary oxide layer having a thickness of 2000 Å and primary nitride layer having a thickness of 2000 Å by LPCVD;

defining an emitter portion and a collector portion to be formed in said N+-type polysilicon by photolithography and then etching unnecessary portions there of by dry etching, said N+-type polysilicon layer being overetched underneath said oxide layer so that the emitter width is formed smaller than 2 μm;

depositing a secondary oxide layer on the whole surface of said defined and overetched substrate by LPCVD and then etching completely the entire upper part of said deposited secondary oxide layer except the polysilicon side wall portions thereof;

depositing a secondary nitride layer of 2000 Å to 3000 Å in thickness thereon and then removing the entire upper part of said secondary nitride layer by plasma etching;

etching the silicon surface around said polysilicon layer to the extent of 1500 Å by dry etching and then growing oxide layer of 500 Å in thickness on the surface said etched portion;

depositing a tertiary nitride layer having thickness of 700 Å thereon by LPCVD and then removing the entire upper part of said tertiary nitride layer by plasma etching;

growing another oxide layer having a thickness of 2500 Å thereon and then removing said primary, secondary and tertiary nitride layers by wet etching;

depositing polysilicon layer having a thickness of 3000 Å on said removed portion and then converting said portion into P+-type conductivity by doping boron ions by thermal diffusion; and defining a portion of said converted polysilicon layer by photolithography and dry etching method and then forming P+-type extrinsic base region by thermal diffusion.

* * * * *

UNITED STATES PATENT AND TRADEMARK OFFICE
CERTIFICATE OF CORRECTION

PATENT NO. : 4,686,762
DATED : August 18, 1987
INVENTOR(S) : Chai, et al.

Figure 1:
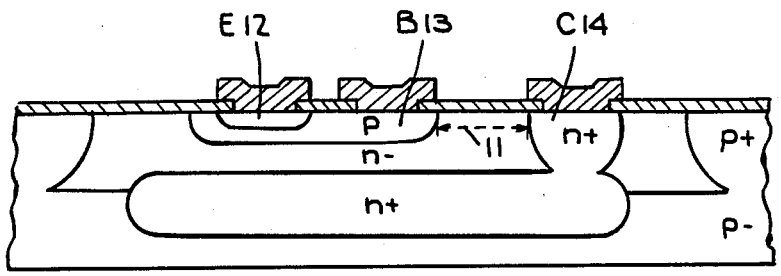
FIG. 1 is a cross sectional view of bipolar NPN transistor by means of P-N junction.
Figure 2:
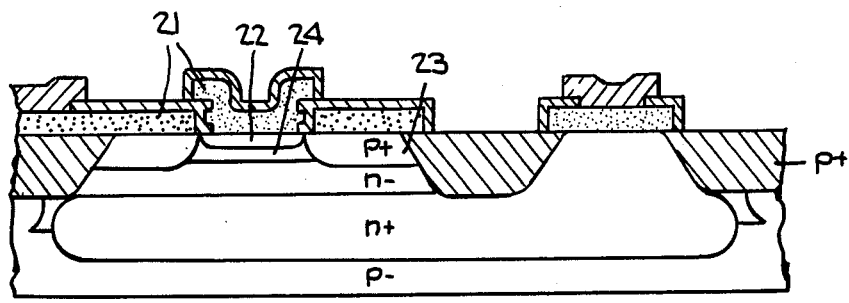
FIG. 2 is a cross sectional view of bipolar NPN transistor by means of polysilicon self-aligned technology.
Figure 3:
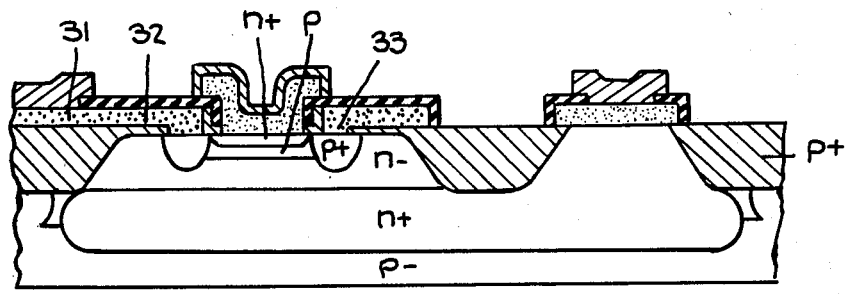
FIG. 3 is a cross sectional view of bipolar NPN transistor by means of super self-aligned technology.

It is certified that error appears in the above—identified patent and that said Letters Patent is hereby corrected as shown below:

In the drawings:

In each of Figs. 2, 3, 4 and 5 A-E, the indicator lines for $p^+$ on the right should not be pointing to the cross hatched area but to the clear area below, as shown by the area labelled as $p^+$ in Fig. 1.

In the specification:

Column 5, line 24: change "depositiong" to --depositing--.

Column 5, line 25: change "ganeral" to --general--.

Signed and Sealed this

Twelfth Day of January, 1988

Attest:

DONALD J. QUIGG

Attesting Officer

Commissioner of Patents and Trademarks